United States Patent
Choi et al.

(10) Patent No.: US 7,486,576 B2
(45) Date of Patent: Feb. 3, 2009

(54) METHODS AND DEVICES FOR PREVENTING DATA STORED IN MEMORY FROM BEING READ OUT

(75) Inventors: Jong-Hyun Choi, Suwon-si (KR); Dong-Il Seo, Yongin-si (KR); Kyu-Chan Lee, Suwon-si (KR); Young-Hun Seo, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/826,367

(22) Filed: Jul. 13, 2007

(65) Prior Publication Data

US 2007/0263461 A1 Nov. 15, 2007

Related U.S. Application Data

(62) Division of application No. 10/761,396, filed on Jan. 22, 2004, now Pat. No. 7,260,002.

(30) Foreign Application Priority Data

Jul. 2, 2003 (KR) .............................. 2003-44676

(51) Int. Cl.
*G11C 7/00* (2006.01)
(52) U.S. Cl. ...................... 365/196; 365/195
(58) Field of Classification Search ................. 365/196
See application file for complete search history.

(56) References Cited

U.S. PATENT DOCUMENTS

| 4,145,761 A | | 3/1979 | Gunter et al. |
| 4,965,769 A | | 10/1990 | Etoh et al. |
| 5,235,691 A | | 8/1993 | Hirosawa |
| 5,793,774 A | * | 8/1998 | Usui et al. ................. 714/719 |
| 5,801,995 A | | 9/1998 | Masumoto |
| 6,125,054 A | * | 9/2000 | Yusa et al. ............. 365/185.04 |
| 6,374,310 B2 | | 4/2002 | Isomura |
| 6,735,142 B1 | | 5/2004 | Oh |

FOREIGN PATENT DOCUMENTS

| DE | 10208246 | 5/2003 |
| KR | 10 2003 0044676 | 11/1988 |
| KR | 1988-0013166 | 11/1988 |
| KR | 2000-0027607 | 5/2000 |

OTHER PUBLICATIONS

Korean Notice dated Apr. 28, 2005 w/English Translation.
German Office Action dated Apr. 26, 2007.

* cited by examiner

*Primary Examiner*—Son L Mai
(74) *Attorney, Agent, or Firm*—Harness, Dickey & Pierce, P.L.C.

(57) ABSTRACT

A dynamic random access memory (DRAM) device, including a DRAM core having memory cells for storing data information, and a read protection unit, prevents data stored in the memory cells before power-off, from being read out at power-on.

5 Claims, 8 Drawing Sheets

METHODS AND DEVICES FOR PREVENTING DATA STORED IN MEMORY FROM BEING READ OUT

PRIORITY STATEMENT

This is a Divisional Application of application Ser. No. 10/761,396, filed Jan. 22, 2004 now U.S. Pat. No. 7,260,002, which is an U.S. nonprovisional patent application claiming priority under 35 U.S.C. § 119 to Korean Patent Application No. 2003-0044676, filed on Jul. 2, 2003, the contents of both of which are hereby incorporated by reference in their entirety.

BACKGROUND OF THE INVENTION

1. Field of the Invention

The present invention relates to a semiconductor memory device, and more particularly, to a volatile semiconductor memory device.

2. Description of Related Art

One type of semiconductor memory device is a dynamic random access memory (DRAM). A DRAM includes memory cells, each of which consists of one access transistor and one capacitor. As is well known, a memory cell stores data in the form of a logic '0' or '1' depending on whether or not an electric charge is stored in the capacitor. One problem associated with DRAMs is that a charge stored in a capacitor may leak out due to various causes. Leaky capacitors cause data stored in a DRAM's memory cell to be lost after a predetermined time period elapses. For example, when the power being supplied to a DRAM is cut-off, any stored data is usually lost when the device remains off for a time period which exceeds the predetermined time period.

That said, even though a DRAM may be cutoff from its power supply, previously stored data may be retained for a few seconds. Provide power is then re-supplied to the DRAM just after it is removed or cut-off, the previously stored data may remain in a memory cell. This may lead to the erroneous output of previously stored data. Accordingly, there is needed a technique that is capable of preventing previously stored data from being read-out when the power supply is re-supplied just after it has been removed or cut-off.

SUMMARY OF THE INVENTION

Accordingly, the present invention is directed to semiconductor memory devices that provide read protection to substantially solve the problems associated with the erroneous output of previously stored data.

An exemplary embodiment of the present invention provides for a semiconductor memory device capable of preventing data, stored before power is removed or cut-off (hereafter collectively referred to as "removed") from being read-out after power is supplied or re-supplied (each term used synonymously herein).

Another exemplary embodiment of the present invention provides for a semiconductor memory device capable of initializing data values stored in memory cells before power is removed.

In yet a further exemplary embodiment, the present invention provides for a semiconductor memory device capable of preventing an initial read out operation after power is re-supplied.

A further exemplary embodiment of the present invention provides for a DRAM including: a DRAM core having memory cells for storing data; and a read protection unit for preventing the data stored in the memory cells before "power-off" (i.e. a time when power is removed), from being read out at "power-on" (i.e., a time when power is supplied or re-supplied).

In another exemplary embodiment, the DRAM core may include: a well region comprising a plurality of memory cells; and a back-bias voltage generator circuit for generating a back-bias voltage to supply to the well region.

The read protection unit may supply one of an internal power supply voltage and an external power supply voltage to the well region in response to an externally supplied reset command and at the same time, inactivate the back-bias voltage generator circuit, such that data values stored in the memory cells are identically set.

Alternatively, the read protection unit may supply one of an internal power supply voltage and the external power supply voltage to the well region in response to whether or not a power supply voltage is lower than a predetermined voltage and at the same time, inactivate the back-bias voltage generator circuit, such that data values stored in the memory cells are identically set.

In another exemplary embodiment, the DRAM core may include: a memory cell array having memory cells, each of which has a plate node; and a plate voltage generator circuit for generating a plate voltage to be supplied to each plate node. In this embodiment, the read protection unit supplies a reset voltage lower than the plate voltage to the plate nodes in response to an externally supplied reset command and at the same time, inactivates the plate voltage generator circuit, such that data values stored in the memory cells are identically set. Alternatively, the read protection unit may supply a reset voltage lower than the plate voltage to the plate nodes in response to whether or not a power supply voltage is lower than a predetermined voltage and at the same time, inactivate the plate voltage generator circuit, such that data values stored in the memory cells are identically set.

In another exemplary embodiment, the read protection unit may include: a register; a power-on detection circuit for detecting whether or not a power supply voltage reaches a target voltage at substantially the same time as power-on to initialize the register; and a control circuit for determining whether a first input command after power-on is a read command according to a stored value of the register, whereby the control circuit does not allow an access operation of the DRAM core when the first input command after power-on is a read command. In this embodiment of the present invention, the control circuit allows the DRAM core to perform an access operation when the first input command after power-on is a write command, and varies a stored value of the register such that the access operation is performed according to a next read command.

Still another exemplary embodiment of the present invention provides for a DRAM including: a back-bias voltage generator circuit for generating a back-bias voltage; a well region comprising a plurality of memory cells, and being biased by the back-bias voltage; and a read protection unit for supplying a reset voltage higher than the back-bias voltage to the well region in response to an externally supplied reset command, such that data values stored in the memory cells are identically set. In this embodiment, the reset voltage may be one of an internal power supply voltage and an external power supply voltage. When the reset voltage is supplied to the well region, the back-bias voltage generator circuit is inactivated by the read protection unit. The read protection unit may include a control circuit for generating an initialization signal in response to the reset command; and a PMOS transistor for transmitting the back-bias voltage and the reset voltage in response to the initialization signal.

In yet another exemplary embodiment of the present invention, there is provided a DRAM including: a back-bias voltage generator circuit for generating a back-bias voltage; a well region comprising a plurality of memory cells formed, and being biased by the back-bias voltage; and a read protection unit for supplying one of an internal power supply voltage and an external power supply voltage to the well region depending on whether or not the power supply voltage is lower than a predetermined voltage, such that data values stored in the memory cells are identically set. In this embodiment, when the internal power supply voltage or the external power supply voltage is supplied to the well region, the back-bias voltage generator circuit is inactivated by the read protection unit. The read protection unit may include: a voltage detection circuit for detecting whether or not a power supply voltage is lower than the predetermined voltage; a control circuit for generating an initialization signal in response to an output signal of the voltage detection circuit; and a PMOS transistor for transmitting the back-bias voltage and the internal power supply voltage or the external power supply voltage in response to the initialization signal.

In a still another exemplary embodiment of the present invention, there is provided a DRAM including: a memory cell array comprising memory cells, each of which has a plate node; a plate voltage generator circuit for generating a plate voltage to be supplied to each plate node; and a read protection unit for supplying a reset voltage lower than the plate voltage to each of the plate nodes in response to an externally supplied reset command, such that data values stored in the memory cells are identically set. In this embodiment, the reset voltage may be a ground voltage. When the reset voltage is supplied to the plate nodes of the memory cells, the plate voltage generator circuit is inactivated by the read protection unit. The read protection unit may include a control circuit for generating an initialization signal in response the reset command; and an NMOS transistor for transmitting the plate voltage and the reset voltage in response to the initialization signal.

In another exemplary embodiment of the present invention, there is provided a DRAM device including: a memory cell array comprising memory cells, each of which has a plate node; a plate voltage generator circuit for generating a plate voltage to be supplied to each of the plate nodes; and a read protection unit for supplying a ground voltage to each of the plate nodes depending on whether or not a power supply voltage is lower than a predetermined voltage, such that data values stored in the memory cells are identically set. In this embodiment, when the ground voltage is supplied to the plate nodes, the plate voltage generator circuit is inactivated by the read protection unit. The read protection unit may include: a voltage detection circuit for detecting whether or not the power supply voltage is lower than the predetermined voltage; a control circuit for generating an initialization signal in response to an output signal of the voltage detection circuit; and an NMOS transistor for transmitting the plate voltage and the ground voltage.

In a still another exemplary embodiment of the present invention, there is provided a DRAM device including: a DRAM core for storing data; a power-on detection circuit for detecting whether or not a power supply voltage reaches a target voltage at power-on; a register for storing reference data depending on an output of the power-on detection circuit; and a control circuit for determining whether or not a first input command after power-on is a read command, depending on values stored in the register, whereby the control circuit does not allow an access operation of the DRAM core when the first input command after power-on is a read command. In this embodiment, the control circuit allows the DRAM core to perform an access operation when a first input command after power-on is a write command, and varies a value of a register, such that the access operation is performed according to a next read command.

In another exemplary embodiment, the present invention provides a DRAM device including: a memory cell array comprising memory cells arrayed in rows and columns; a reset control circuit for generating an initialization signal and a latch signal in response to an externally supplied reset command, a refresh control circuit for sequentially generating row addresses in response to the initialization signal; a row selection circuit for sequentially selecting rows in response to the row addresses; and burst write means, operating in response to the initialization signal, for sequentially selecting columns in a desired unit whenever each of the rows is selected and writing the same data into memory cells associated with the selected columns, such that data stored in the memory cells before power-off is not read out at power-on. In this embodiment, the burst write means may include: an address generator circuit for sequentially generating column addresses in response to the initialization signal; a column selection circuit for generating column selection signals and for selecting the columns in the unit in response to the column addresses; a data input buffer for setting input/output lines to a same value in response to the initialization signal; a column gate circuit for selecting the columns in the unit in response to the column selection signals and for connecting the selected columns to the input/output lines; and a sense amplification circuit for performing a sense amplification operation such that data of the selected columns is stored in corresponding memory cells.

In another exemplary embodiment, the present invention may include a semiconductor memory device which includes an address register for latching a row address first output from a refresh control circuit in response to a latch signal; and a comparative circuit for determining whether or not a row address output from the refresh control circuit coincides with an address stored in the address register. In this embodiment, when the row address output from the refresh control circuit coincides with an address stored in the address register, the reset control circuit inactivates the refresh control circuit and the burst write means in response to an output signal of the comparative circuit.

Further embodiments of the present invention include methods for carrying out the features and functions of the devices described above.

In an exemplary embodiment of the present invention, there is provided a method for preventing data stored in memory from being read-out comprising storing data in DRAM core memory cells, and preventing the data stored in the memory cells before power is removed, from being read out when power is supplied.

In another exemplary embodiment of the present invention, there is provided a method for preventing data stored in memory from being read-out comprising generating a back-bias voltage and biasing a well region comprising a plurality of memory cells with the back bias voltage, and supplying the well region with a reset voltage higher than the back-bias voltage in response to an externally supplied reset command, such that data values stored in the memory cells are identically set.

In still another exemplary embodiment of the present invention, there is provided a method for preventing data stored in memory from being read-out comprising generating a back-bias voltage and biasing a well region comprising a plurality of memory cells with the back bias voltage, and supplying the well region with one of an internal power supply voltage and an external power supply voltage depending on whether or not a power supply voltage is lower than a predetermined voltage, such that data values stored in the memory cells are identically set.

In a still another exemplary embodiment of the present invention, there is provided a method for preventing data stored in memory from being read-out comprising generating a plate voltage to be supplied to each plate node of each memory cell, and supplying each plate node with a reset voltage lower than the supplied plate voltage in response to an externally supplied reset command, such that data values stored in memory cells are identically set.

In a still another exemplary embodiment of the present invention, there is provided a method for preventing data stored in memory from being read-out comprising generating a plate voltage to be supplied to each plate node of each memory cell, and supplying each plate node with a ground voltage depending on whether a power supply voltage is lower than a predetermined voltage, such that data values stored in memory cells are identically set.

In a still another exemplary embodiment of the present invention, there is provided a method for preventing data stored in memory from being read-out comprising storing data in a DRAM core, detecting whether or not a power supply voltage reaches a target voltage at power-on, storing reference data depending on whether or not a power supply voltage reaches a target voltage at power-on, and determining whether or not a first input command after power-on is a read command, depending on values stored in a register, whereby an access operation is performed when the first input command after power-on is a read command.

In a still another exemplary embodiment of the present invention, there is provided a method for preventing data stored in memory from being read-out comprising a memory cell array having memory cells arrayed in rows and columns, generating an initialization signal and a latch signal in response to an externally supplied reset command, sequentially generating row addresses in response to the initialization signal, sequentially selecting rows in response to the generated row addresses, and, in response to the initialization signal, sequentially selecting columns in a unit whenever each row is selected and writing the same data into memory cells associated with the selected columns, such that data stored in the memory cells before power-off is not read out at power-on.

In a still another exemplary embodiment of the present invention, there is provided a method for preventing data stored in memory from being read-out comprising generating a back-bias voltage and biasing a well region comprising a plurality of memory cells with the back bias voltage, and supplying the well region with a reset voltage higher than the back-bias voltage in response to an externally supplied reset command, such that data values stored in the memory cells are identically set, said method carried out by a well region comprising the plurality of memory cells, a back-bias voltage generator circuit for generating the back-bias voltage and for biasing the well region with the back bias voltage, and a read protection unit for supplying the well region with the reset voltage higher than the back-bias voltage in response to the reset command provided from the exterior.

In a still another exemplary embodiment of the present invention, there is provided a method of preventing data stored in memory from being read out comprising generating a back-bias voltage and biasing a well region comprising a plurality of memory cells with the back bias voltage, and supplying the well region with one of an internal power supply voltage and an external power supply voltage depending on whether or not a power supply voltage is lower than a predetermined voltage, such that data values stored in the memory cells are identically set, the method carried out by a well region comprising the plurality of memory cells, a back-bias voltage generator circuit for generating the back-bias voltage and for biasing the well region with the back bias voltage, and a read protection unit for supplying the well region with one of the internal power supply voltage and the external power supply voltage depending on whether or not the power supply voltage is lower than the predetermined voltage.

In a still another exemplary embodiment of the present invention, there is provided a method for preventing data stored in memory from being read-out comprising generating a plate voltage to be supplied to each plate node of each memory cell, and supplying each plate node with a reset voltage lower than the supplied plate voltage in response to an externally supplied reset command, such that data values stored in memory cells are identically set, the method carried out by a memory cell array comprising memory cells, each of which includes a plate node, a plate voltage generator circuit for generating the plate voltage to be supplied to each plate node, and a read protection unit for supplying each plate node with the reset voltage lower than the supplied plate voltage in response to the externally supplied reset command.

In a still another exemplary embodiment of the present invention, there is provided a method for preventing data stored in memory from being read-out comprising generating a plate voltage to be supplied to each plate node of each memory cell, and supplying each plate node with a ground voltage depending on whether a power supply voltage is lower than a predetermined voltage, such that data values stored in memory cells are identically set, the method carried out by a memory cell array comprising memory cells, each of which includes a plate node, a plate voltage generator circuit for generating the plate voltage to be supplied to each plate node, and a read protection unit for supplying each plate node with the ground voltage depending on whether the power supply voltage is lower than the predetermined voltage.

In a still another exemplary embodiment of the present invention, there is provided a method for preventing data stored in memory from being read-out comprising storing data in a DRAM core, detecting whether or not a power supply voltage reaches a target voltage at power-on, storing reference data depending on whether or not a power supply voltage reaches a target voltage at power-on, and determining whether or not a first input command after power-on is a read command, depending on values stored in a register, whereby an access operation is performed when the first input command after power-on is a read command, said method carried out by a DRAM core for storing the data, a power-on detection circuit for detecting whether or not the power supply voltage reaches the target voltage at power-on, a register for storing the reference data depending on the output of the power-on detection circuit, and a control circuit for determining whether or not the first input command after power-on is the read command, depending on the values stored in the register, whereby the control circuit does not allow the DRAM core to perform the access operation when the first input command after power-on is the read command.

It should be understood that both the foregoing description and the following detailed description of the present invention are intended to provide a few examples of the present inven-

BRIEF DESCRIPTION OF THE DRAWINGS

The accompanying drawings, together with the descriptions herein, are included to further explain the principles of the present invention.

DETAILED DESCRIPTION OF EXAMPLE EMBODIMENTS

Reference will now be made to exemplary embodiments of the present invention, examples of which are illustrated in the accompanying drawings. However, the present invention is not limited to the embodiments illustrated herein. Rather, the embodiments herein are introduced to provide an understanding of the spirit and scope of the present invention.

Figure 1:
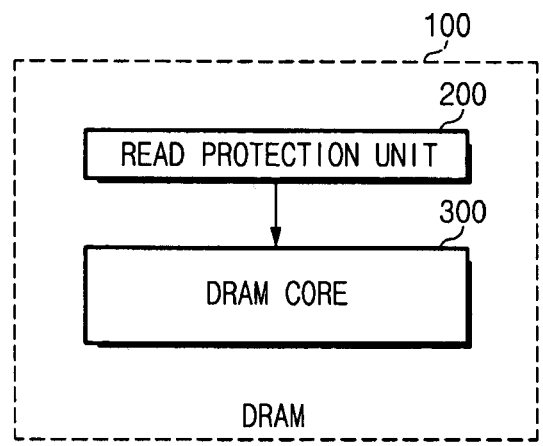
FIG. 1 is a block diagram illustrating a semiconductor memory device according to an exemplary embodiment of the present invention.

A schematic block diagram illustrating a semiconductor memory device 100 according to an exemplary embodiment of the present invention is shown in FIG. 1. The semiconductor memory device 100 is a DRAM device, though it will become apparent to those of ordinary skill in the art that the scope of the present invention is not limited to DRAMs.

The semiconductor memory device 100 includes a read protection unit 200 and a DRAM core 300. The DRAM core 300 may be comprised of a memory cell array for storing data information; a data writing circuit for writing data into the memory cell array; and a data reading circuit for reading data from the memory cell array, etc. An example of DRAM core 300 is exemplified in U.S. Pat. No. 6,564,287 entitled "SEMICONDUCTOR MEMORY DEVICE HAVING A FIXED CAS LATENCY AND/OR BURST LENGTH".

The read protection unit 200 prevents data stored before power is removed (that is, before power-off) from being read out after power is re-supplied (that is, after power-on). For instance, the DRAM device 100 may initialize all of the memory cells (see FIG. 2) using a logic '0' or '1' depending on the input of a predetermined command (e.g., a "reset command") before power-off to accomplish a read protection function. Or, the DRAM device 100 may prevent a reading operation of the DRAM core 300 from being performed when a read command is first input at power-on to accomplish the read protection function. Hereinafter, various exemplary embodiments for accomplishing the read protection function will be described in more detail.

Figure 2:
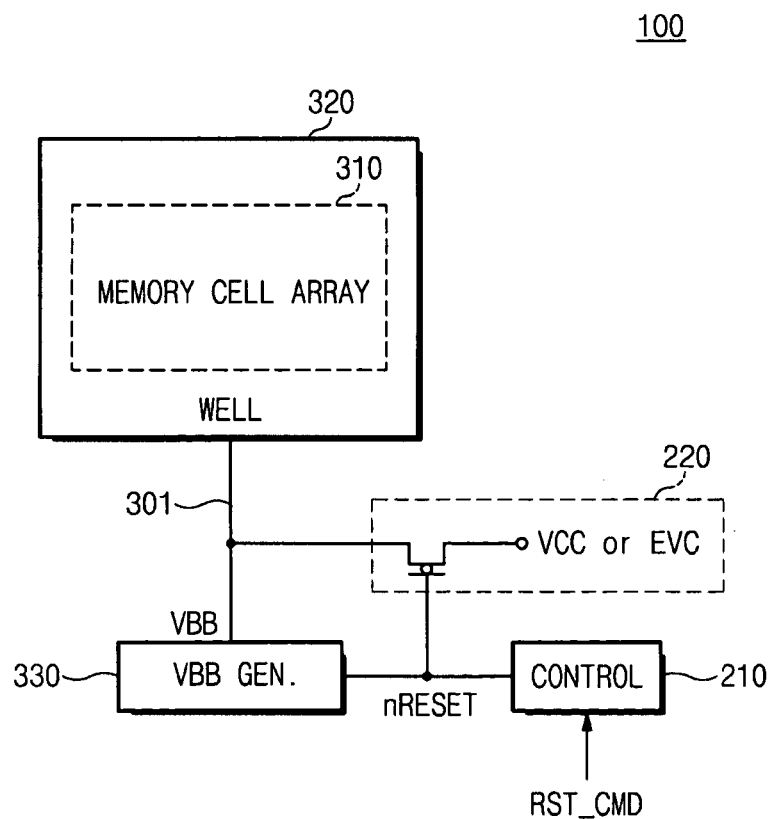
FIG. 2 is a block diagram illustrating a semiconductor memory device according to another exemplary embodiment of the present invention.

Referring to FIG. 2, semiconductor memory device 100 is shown including a memory cell array 310 and a back-bias voltage generator circuit 330. The memory cell array 310 is formed in a well region 320. The well region 320, though not shown in detail in the drawings, may be formed separately from a well region in which a peripheral circuit (for example, a sense amplification circuit) is formed. The back-bias voltage generator circuit 330 supplies a back-bias voltage (VBB) to the well region 320 in which the memory cell array 310 is formed. The memory cell array 310 and the back-bias voltage generator circuit 330 constitute the DRAM core 300 of FIG. 1. As is well known, the back-bias voltage (VBB) is supplied to the well region 320 to stabilize a threshold voltage of an access transistor included in the memory device in order to prevent the build-up of a parasitic capacitance which in turn prevents the erroneous operation of the memory device caused by an external signal undershoot. One example of the back-bias voltage generator circuit 330 is exemplified in U.S. Pat. No. 5,262,989 entitled "CIRCUIT FOR SENSING BACK-BIAS LEVEL IN A SEMICONDUCTOR MEMORY DEVICE".

The semiconductor memory device 100 may further include a reset control circuit 210 and a switch 220 which constitute the read protection unit 200 of FIG. 1. The reset control circuit 210 generates an initialization signal (nRESET) in response to an externally supplied reset command (RST_CMD). The switch 220 is comprised of a PMOS transistor, including a gate connected to receive the initialization signal (nRESET), a drain connected to an internal power supply voltage (VCC) or an external power supply voltage (EVC), and a source connected to a voltage line 301 for supplying the back-bias voltage (VBB). When the reset command is input, the reset control circuit 210 activates the initialization signal (nRESET) to be in a low level. When the initialization signal (nRESET) is activated, the back-bias voltage generator circuit 330 is inactivated, and the PMOS transistor of the switch 220 is turned-on. This allows the VCC or EVC voltage to be supplied to the voltage line 301 through the PMOS transistor. In other words, the VCC or EVC voltage, instead of the back-bias voltage (VBB), is supplied to the well region 320. This causes the data values stored in the memory cells to be set to the same value. This means that previously stored data will not be read out when power is re-supplied after the power had been previously removed.

Figure 3:
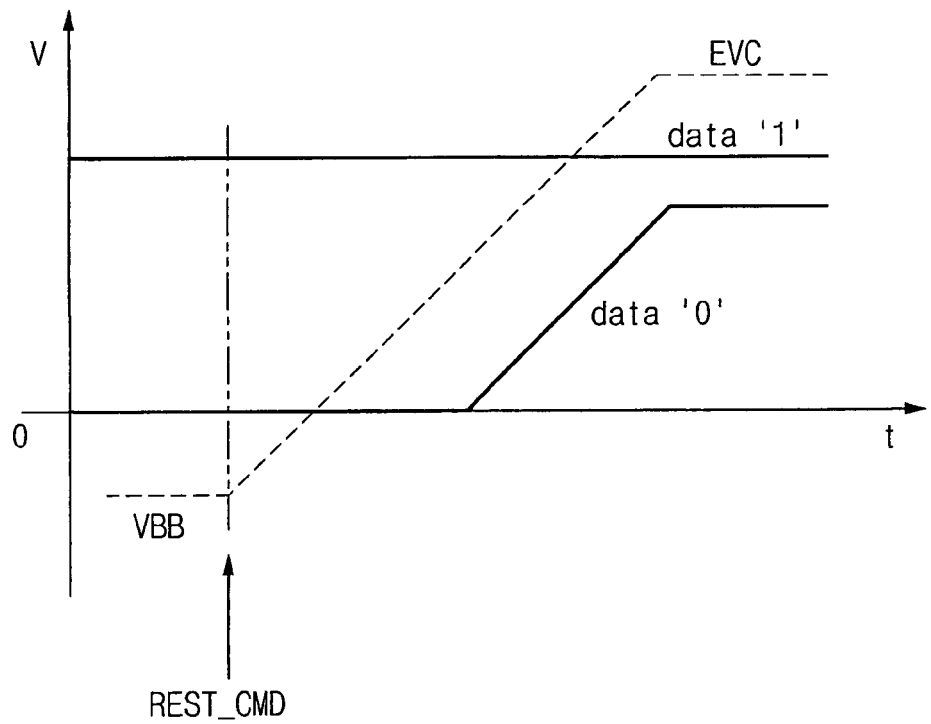
FIG. 3 is an graph illustrating various back-bias voltages before and after a reset command is input.
Figure 4:
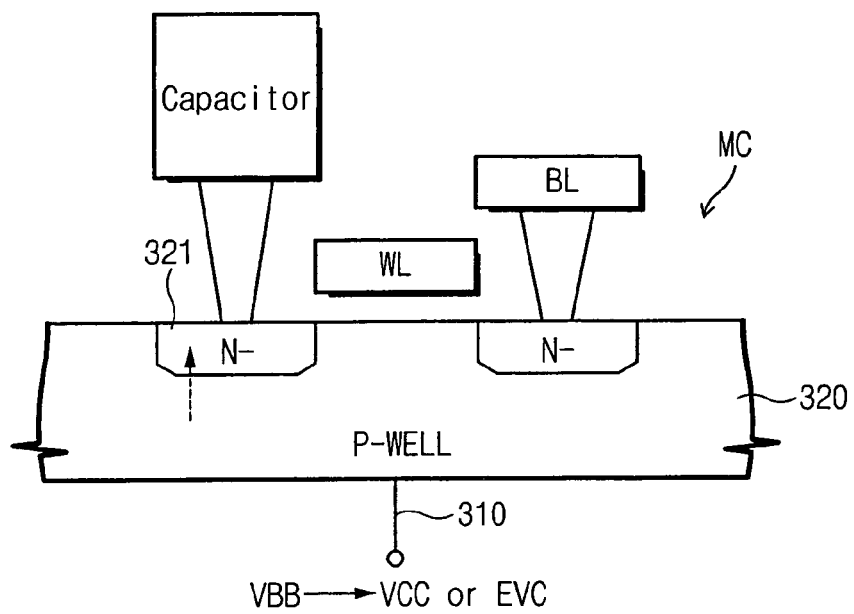
FIG. 4 is a view illustrating a PN-junction, forward bias operation occurring when a back bias voltage is varied upon input of a reset command.

Referring to FIGS. 3 and 4, the above-described operation will be described in more detail as follows. FIG. 3 illustrates a graph of back-bias voltage variations before and after a reset command is input. FIG. 4 illustrates a PN-junction, forward bias operation occurring when a back-bias voltage is varied upon input of a reset command.

Before a reset command (RST_CMD) is input, a back-bias voltage (VBB) is applied to the well region 320. This allows the memory cell to retain data. When, however, the externally supplied reset command (RST_CMD) is input before power-off, the reset control circuit 210 activates the initialization signal (nRESET), allowing the VCC or EVC voltage instead of the VBB voltage to be supplied to the well region 320. As the VCC or EVC voltage is supplied to the well region 320, as shown by a dotted line in FIG. 4, a PN junction between the well region 320 and an N-typed impurity region 321 becomes forward-biased. This allows a capacitor of memory cell (MC) to become electrically charged, causing all of the memory cells in well region 320 to store a logic '1' irrespective of the previously stored logic state. As a result, because all of the memory cells store a logic '1' when power is re-supplied after power-off, previously stored data is not read out.

Figure 5:
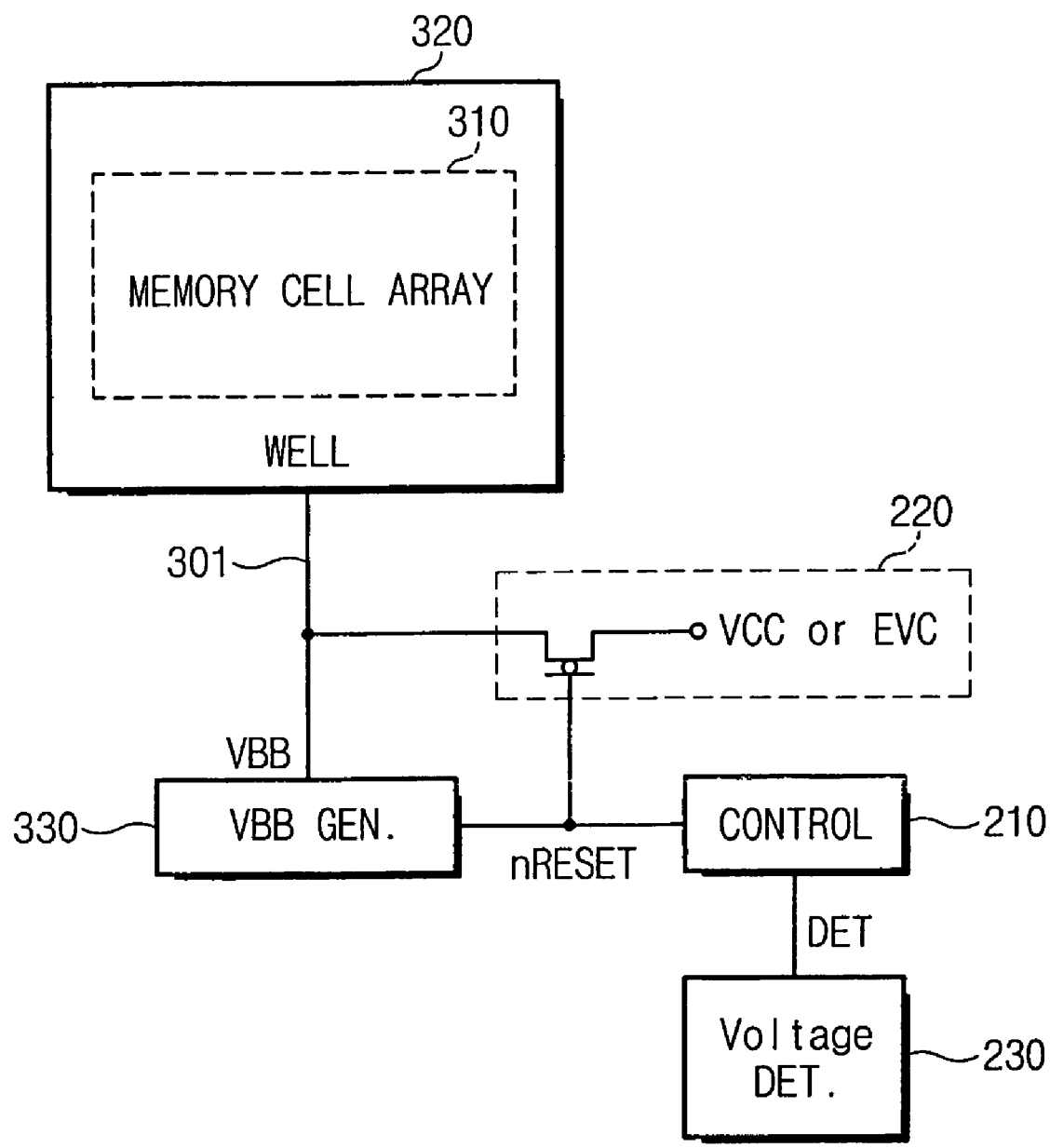
FIG. 5 is a block diagram illustrating a semiconductor memory device according to an additional exemplary embodiment of the present invention.

Referring to FIG. 5, there is shown a semiconductor memory device 100 according to another exemplary embodiment of the present invention. In FIG. 5, elements performing the same functions as the elements of FIG. 2 are indicated by the same reference numerals, and their descriptions are also omitted. In this embodiment, device 100 further includes a voltage detecting circuit 230. The voltage detecting circuit 230 detects whether or not an internal power supply voltage (VCC) or an external power supply voltage (EVC) is lower than a predetermined voltage. If it is, circuit 230 generates a detection signal (DET). Upon receiving the detection signal (DET), the reset control circuit 210 activates an initialization signal (nRESET). As before, when the initialization signal (nRESET) is activated, a back-bias voltage generator circuit 330 is inactivated and a PMOS transistor of a switch 220 is turned on. This again allows the VCC or EVC voltage to be supplied to a voltage line 301 through the PMOS transistor of the switch 220 causing the data stored in the memory cell array 310 to be set to the same value. Again, this means that previously stored data is not read out when power is re-supplied after having been removed.

Figure 6:
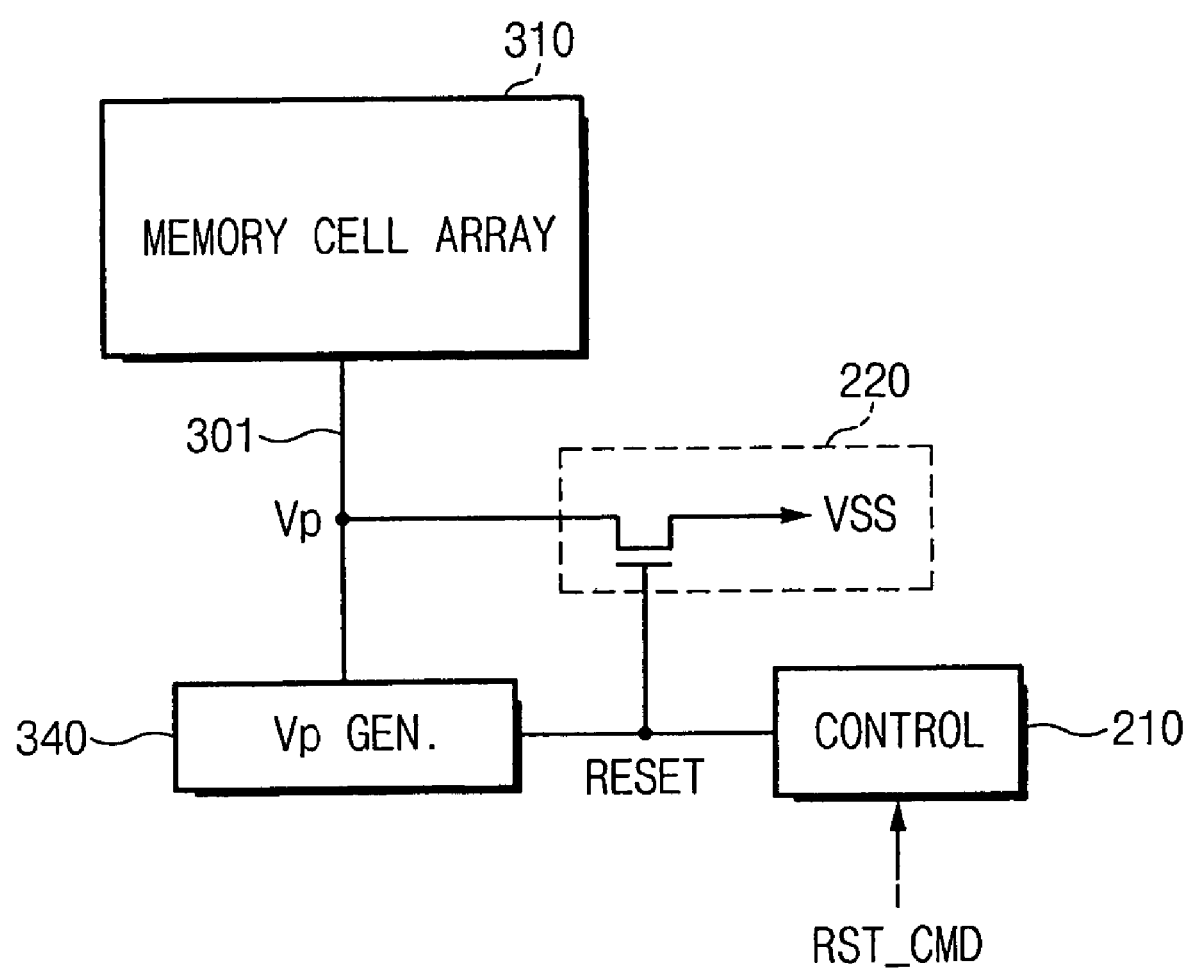
FIG. 6 is a block diagram illustrating a semiconductor memory device according to yet another exemplary embodiment of the present invention.

Referring to FIG. 6, there is shown a semiconductor memory device 100 according to another exemplary embodiment of the present invention. In FIG. 6, elements performing the same functions as elements of FIG. 2 are indicated by the same reference numerals. In this embodiment, the device 100 includes a memory cell array 310 and a plate voltage generator circuit 340. As is well known, the memory cell array 310 may include a plurality of memory cells arrayed in a matrix of word and bit lines. Each memory cell within array 310 comprises an access transistor and a capacitor. One electrode of the capacitor is connected to a bit line through the access transistor. The other electrode is connected in such a way that it is supplied with a plate voltage (Vp). Hereinafter, this latter capacitor electrode is referred to as a "plate node". The plate voltage generator circuit 340 supplies the plate voltage (Vp) to each plate node of each memory cell of the memory cell array 310. The memory cell array 310 and the plate voltage generator circuit 340 may constitute a DRAM core 300 as shown in FIG. 1.

Continuing, the semiconductor memory device 100 may further include a reset control circuit 210 and a switch 220 constituting a read protection unit, such as unit 200 in FIG. 1. The reset control circuit 210 generates an initialization signal (RESET) in response to the reset command (RST_CMD). The switch 220 may be comprised of an NMOS transistor including a gate connected to receive the initialization signal (RESET), a source connected to a ground voltage (VSS) and a drain connected to the voltage line 301 for supplying the plate voltage (Vp). The reset control circuit 210 activates the initialization signal (RESET) to a high level when the reset command (RST_CMD) is input. When the initialization signal (RESET) is activated, the plate voltage generator circuit 340 is inactivated and the NMOS transistor of the switch 220 is turned on. This allows the voltage line 301 to be connected to the ground voltage through the NMOS transistor of the switch 220. That is, the ground voltage (VSS) instead of the plate voltage (Vp) is supplied to each plate node of each memory cell. This causes the data stored in the memory cells to be set to the same value, preventing previously stored data from being read out when power is re-supplied after having been previously removed.

Figure 7:
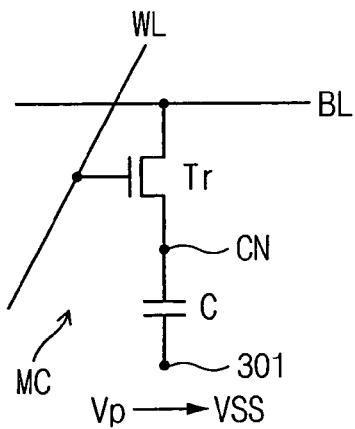
FIG. 7 is a circuit diagram illustrating a data initialization operation occurring when a plate voltage is varied upon input of a reset command.

Referring now to FIG. 7, a data initialization operation that occurs when a plate voltage is varied upon input of a reset command is illustrated.

Before a reset command (RST_CMD) is input, the plate electrode (that is, voltage line) of the memory cell (MC) is supplied with the plate voltage (Vp). This allows the memory cell (MC) to retain previously stored data. If an externally supplied reset command is input before power-off, the reset control circuit 210 activates the initialization signal (RESET), allowing a ground voltage (VSS) instead of the plate voltage Vp to be supplied to the plate node 301 of the memory cell (MC). Because a capacitor electrode (CN) connected to an access transistor (Tr) is in a floating state when the ground voltage (VSS) is supplied to a plate node 301 of a memory cell of the array 310, the charge on the capacitor (C) is discharged to the voltage line 301 due to a coupling effect. That is, all of the memory cells store data in the form of a logic '0' irrespective of any previously stored logic state. As a result, because all of the memory cells store data in the form of a logic '0' when power is re-supplied after power-off, previously stored data is not read out.

Figure 8:
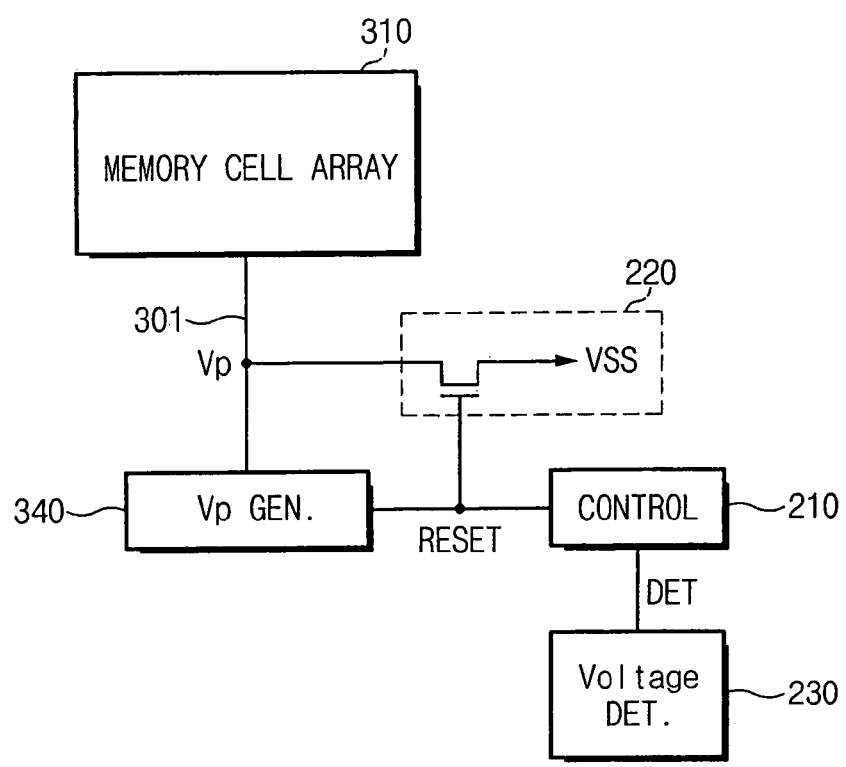
FIG. 8 is a block diagram illustrating a semiconductor memory device according to another exemplary embodiment of the present invention.

Referring now to FIG. 8, there is shown a block diagram illustrating a semiconductor memory device 100 according to yet another exemplary embodiment of the present invention.

In FIG. 8, elements that perform the same functions as elements of FIG. 7 are indicated by the same reference numerals. Their descriptions are also omitted.

Referring to FIG. 8, the semiconductor memory device 100 may further include a voltage detecting circuit 230. The voltage detecting circuit 230 detects whether or not an internal power supply voltage (VCC) or an external power supply voltage (EVC) is lower than a predetermined voltage. If so, circuit 230 generates a detection signal (DET). Upon receiving the detection signal (DET), the reset control circuit 210 activates an initialization signal (RESET). When the initialization signal (RESET) is activated, a plate voltage generator circuit 340 is inactivated and an NMOS transistor of a switch 220 is turned on. This allows a ground voltage (VSS) to be supplied to a voltage line 301 through the NMOS transistor of the switch 220. That is, the ground voltage (VSS) instead of a plate voltage (Vp) is supplied to the plate nodes of the memory cells, causing the data stored in the memory cells to be set to the same value, preventing previously stored data from being read when power is again re-supplied after having been removed.

Figure 9:
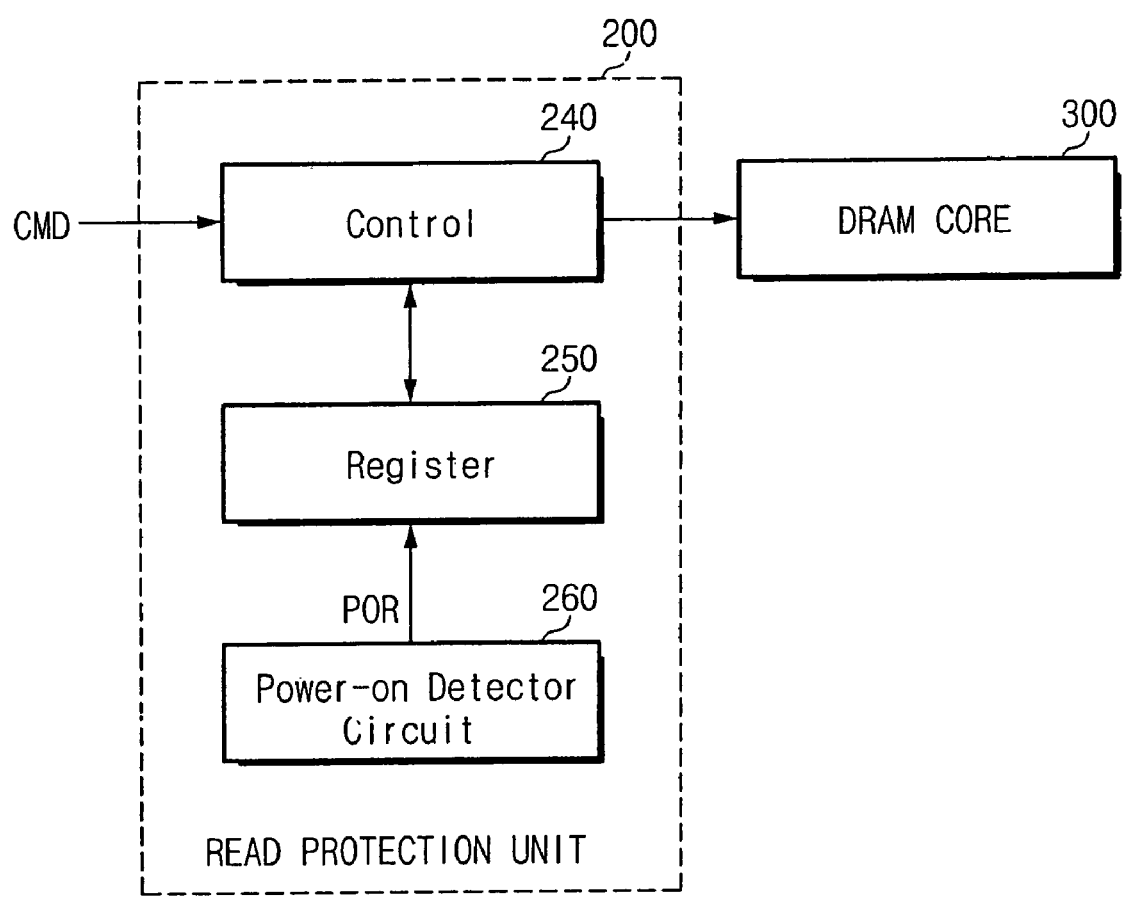
FIG. 9 is a block diagram illustrating a semiconductor memory device according to another exemplary embodiment of the present invention.

Referring now to FIG. 9, there is shown a block diagram illustrating a semiconductor memory device 100 according to still another exemplary embodiment of the present invention. The inventive semiconductor memory device 100 may include a read protection unit 200 for controlling an access operation of a DRAM core 300. The read protection unit 200 may comprise a read/write control circuit 240, a register 250 and a power-on detector circuit 260. The power-on detector circuit 260 detects whether or not a power supply reaches a predetermined voltage. If so, the circuit 260 generates a power-on detection signal (POR). The register 250 stores information representing whether or not a write command is applied after power is applied. The information is set by the power-on detection signal (POR). One register value set by the power-on detection signal (POR) indicates that the write command is not applied first after power is applied (or re-supplied). The read/write control circuit 240 controls a read/ write operation of the DRAM core 300, and prevents a read operation of the DRAM core 300 from being performed depending on information stored in the register 250.

Power-on detector circuits are exemplified in: U.S. Pat. No. 6,236,249 entitled "POWER-ON RESET CIRCUIT FOR A HIGH DENSITY INTEGRATED CIRCUIT"; U.S. Pat. No. 6,040,722 entitled "POWER-ON RESET CIRCUIT WITH ADJUSTABLE INTERVAL"; U.S. Pat. No. 5,578,951 entitled "CMOS CIRCUIT FOR IMPROVED POWER-ON RESET TIMING"; and U.S. Pat. No. 5,039,875 entitled "CMOS POWER-ON RESET CIRCUIT", to name just a few examples.

In operation, when an initially input command is a read command after power-on, for example, the read/write control circuit 240 does not allow data to be read out of the DRAM core 300 (in response to a logic '0' stored in the register 250). However, when the initially input command is a write command after power-on, the read/write control circuit 240 sets the register 250 to a logic '1' and at the same time, allows the DRAM core 300 to perform a write operation. After that, if a read command is input, because the register 250 is set to '1', the read/write control circuit 240 may allow the DRAM core 300 to perform a normal read operation. As a result, it is highly unlikely that data stored before power-off can be accessed just after power-on. That is, because a read operation is performed after a write operation is performed, when power is again re-supplied after having been removed, any previously stored data is not read out.

Figure 10:
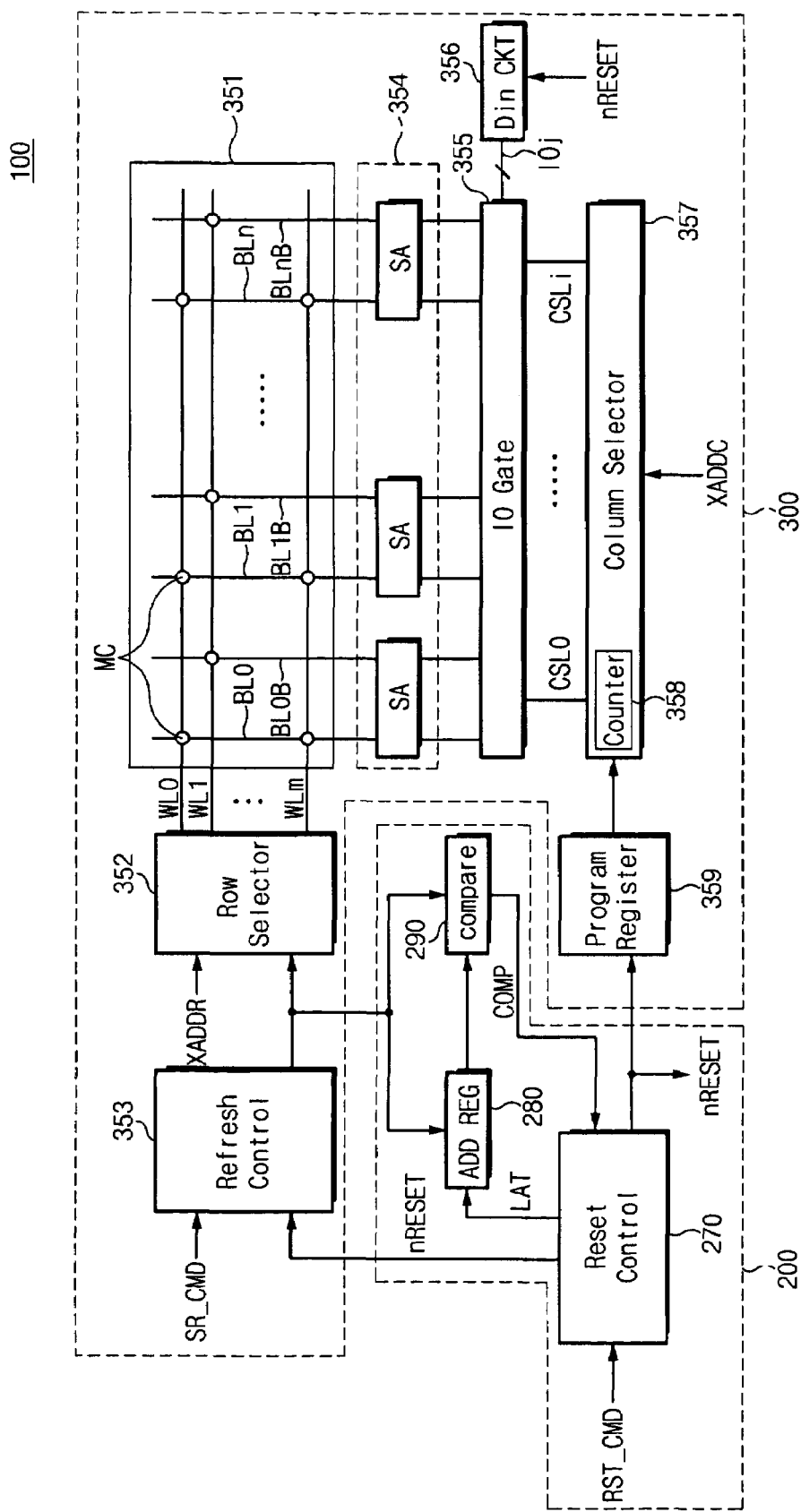
FIG. 10 is a block diagram illustrating a semiconductor memory device according to yet another exemplary embodiment of the present invention.

Referring to FIG. 10, there is shown a block diagram illustrating a semiconductor memory device 100 according to a further exemplary embodiment of the present invention. The semiconductor memory device 100 may include a memory cell array 351 for storing data. The memory cell array 351 includes memory cells (MC) (indicated by the symbol or connection "o" in FIG. 10) arrayed in a matrix of word lines (WL0-WLm) and bit lines (BL0-BLn, BL0B-BLnB). A row selection circuit 352 selects one of the word lines (WL0-WLm) in response to an externally supplied row address (XADDR) in a read/write operation mode. Or, in a self-refresh operation mode, the row selection circuit 352 may sequentially select word lines (WL0-WLm) in response to addresses sequentially output from a refresh control circuit 353.

A column selection circuit 357 generates column selection signals (CSL0-CSLi) in response to an externally supplied column addresses (XADDC) in a normal read/write operation mode. The column selection circuit 357 may further include a counter 358 for sequentially generating a column address depending on a burst length value programmed into a program register 359 operating in a burst write mode. For instance, for a given burst length of 4, the counter 358 sequentially creates the column addresses four times. Or, when the burst length is set to activate all of the column selection signals (hereinafter, such a burst length is referred to as a "full burst length"), the counter 358 may create a column address such that all of the column selection signals (CSL0-CSLi) are sequentially activated one-by-one. Alternatively, some may be activated simultaneously. When the burst length is set to the full burst length, the counter 358 is initialized whenever the word line is activated. As a result, the counter 358 may sequentially create column addresses such that all of the column selection signals (CSL0-CSLi) are sequentially activated one-by-one. Again, alternatively some may be activated simultaneously. The program register 359 may comprise a mode register set (MRS) circuit that is well known.

FIG. 10 also depicts a sense amplification circuit 354 that may include sense amplifiers (indicated by "SA" in FIG. 10) connected to bit line pairs (BL0, BL0B)-(BLn, BLnB). The sense amplifiers (SA) sense and amplify bit line voltages of corresponding pairs. In addition, a column, gate circuit 355 selects a portion of the bit line pairs in response to column selection signals (CSL0-CSLi) output from the column selection circuit 357. A data input circuit 356 operates in response to an initialization signal (nRESET). For instance, while the initialization signal (nRESET) is maintained in an inactivated state, the data input circuit 356 receives external data in a write operation mode. This data is transmitted to the selected bit line pairs through the column gate circuit 355. In contrast, while the initialization signal (nRESET) is maintained in an activated state, the data input circuit 356 sets input/output lines (IOj) to the same value (for example, a logic '1').

The semiconductor memory device 100 may further include a reset control circuit 270, an address register 280 and a comparative circuit 290. The reset control circuit 270, address register 280 and comparative circuit 290 may constitute a read protection unit, such as unit 200 shown in FIG. 1. The reset control circuit 270 detects whether or not a reset command (RST_CMD) is input. If the reset command (RST_CMD) is input, the reset control circuit 270 activates the initialization signal (nRESET). A program register 359 is set to have a value of the full burst length according to the activation of the initialization signal (nRESET). A refresh control signal 353 generates a row address such that the word lines (WL0-WLm) are sequentially activated in a similar manner as in the self-refresh mode according to the activation of the initialization signal (nRESET). Further, the refresh control circuit 353 generates a row address such that the word lines (WL0-WLm) are sequentially activated when the self-refresh command (SR_CMD) is input.

When the reset command (RST_CMD) is input, the reset control circuit 270 may also generate a latch signal (LAT). When the latch signal (LAT) is activated, a first row address created by the refresh control circuit 353 is latched to the address register 280. The comparative circuit 290 determines whether or not the row address outputted from the refresh control circuit 353 coincides with the row address stored in an address register 280. The comparative circuit 290 then activates a comparative signal (COMP) while the reset control circuit 270 inactivates the refresh control circuit 353 and data input circuit 356 in response to the activation of the comparative signal (COMP).

Figure 11:
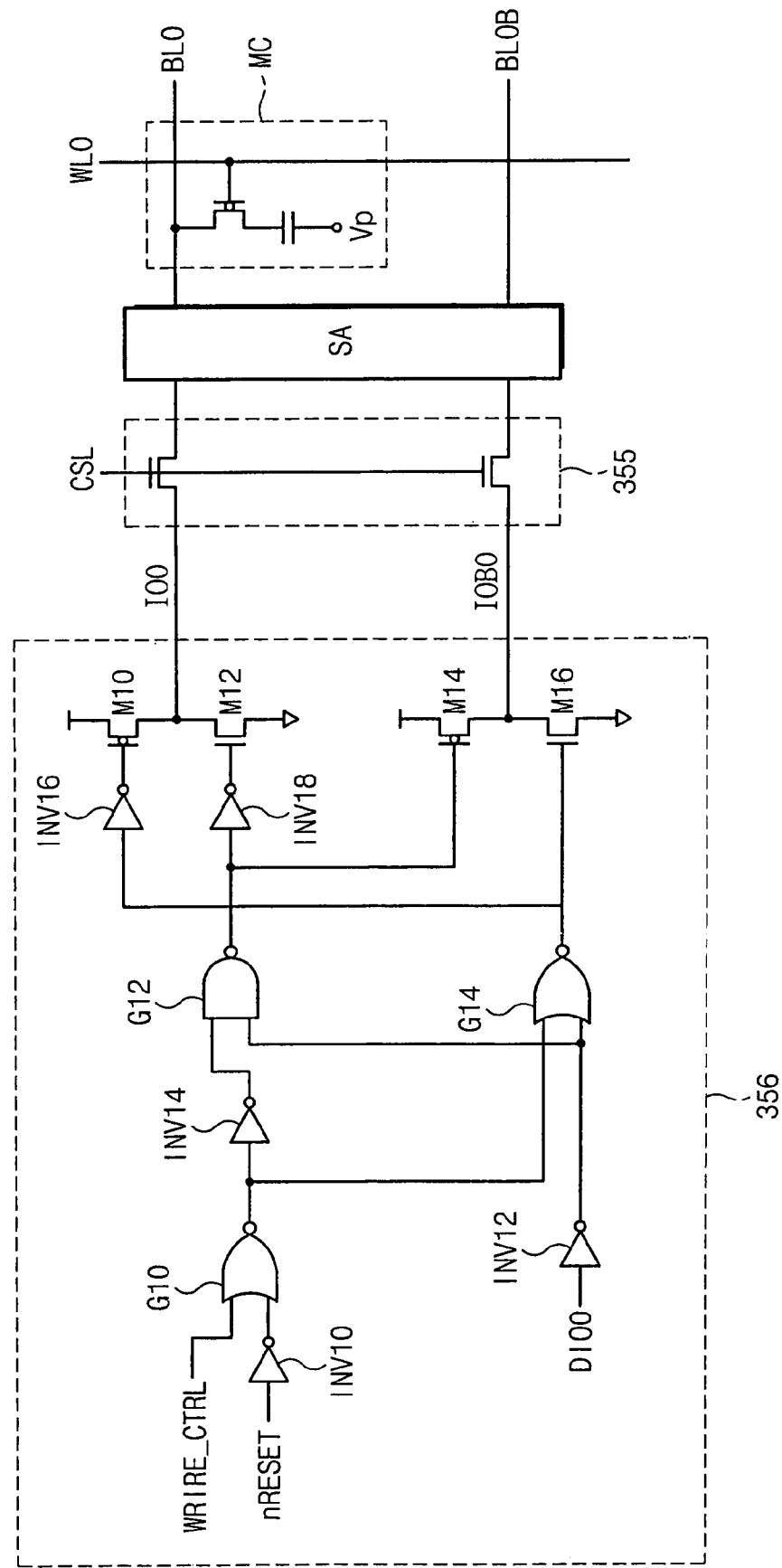
FIG. 11 is a circuit diagram illustrating a portion of a data input circuit included in the device shown in FIG. 10 according to an exemplary embodiment of the present invention.

Referring now to FIG. 11, there is shown a circuit diagram illustrating a portion of the data input circuit 356 shown in FIG. 10 according to an exemplary embodiment of the present invention. The data input circuit 356 may comprise inverters (INV10, INV12, INV14, INV16, INV18), NOR gates (G10, G14), a NAND gate (G12), PMOS transistors (M10, M14) and NMOS transistors (M12, M16), connected as shown in FIG. 11. A control signal (WRITE_CTRL) is activated at a high level when a write operation is performed. A data line (DI00) is pre-charged at a high level at the time of the read/write operation. When the control signal (WRITE_CTRL) is inactivated at a low level and the control signal (nRESET) is activated at the low level, the NAND gate (G12) and the NOR gate (G14) output high-level signals. This allows the transistors (M12, M14) to be turned off and the transistors (M10, M16) to be turned on. Accordingly, when the control signal (nRESET) is activated at a low level, an input/output line (IO0) is set at the high level, and an input/output line (IO0B) is set at the low level.

Read protection operations of semiconductor memory devices according to exemplary embodiments of the present invention will now be described in more detail with reference to FIGS. 10 and 11.

In order to prevent the data stored in memory cell array 351 before power-off from being read out after power-on, the reset command (RST_CMD) may first be provided to the semiconductor memory device 100 before power is removed. A reset control circuit 270 then activates an initialization signal (nRESET) depending on the input of the reset command (RST_CMD). According to the activation of the initialization signal (nRESET), the refresh control circuit 353 generates a row address. At the same time, the program register 359 is set to a full burst length value, while the data input circuit 356 sets the input/output lines (IOj) by the same value. As the refresh control circuit 353 generates the row address, the row selection circuit 352 selects a word line (for example, WL0) for the row address. An initial row address created by the refresh control circuit 353 is stored in an address register 280 under control of the reset control circuit 270.

The column selection circuit 357 may sequentially activate column selection signals (CSL0-CSLi) in response to the column addresses sequentially created by an internal counter 358. Assuming that an input/output line structure is X8, when one column selection signal is activated, eight bit line pairs will be selected, eight column gate transistor pairs are turned on, and the data values on the input/output lines (IOj) are transmitted to the corresponding bit line pairs through the turned-on transistors of the column gate circuit 355. Next, as the sense amplifiers are activated, a logic '1' will be written into the memory cells selected by the column selection signal. As all of the column selection signals are sequentially activated, a logic '1' is stored in all of the memory cells of the selected word line.

When a logic '1' is stored in all of the memory cells of the selected word line (WL0), the refresh control circuit 353 generates a row address to select a next word line (WL1). The row selection circuit 352 selects a word line (for example, WL0) for the row address. At the same time, as the column selection circuit 352 sequentially activates column selection signals (CSL0-CSLi) in response to column addresses sequentially created by the internal counter 358, a logic '1' is stored in the memory cells of the word line (WL1) selected in the same manner as described above using the data input circuit 256, input/output gate circuit 255 and sense amplification circuit 354.

While word lines are sequentially selected, the comparative circuit 290 determines whether or not a row address created by the refresh control circuit 353 coincides with a row address stored in the address register 280. When the row address created in the refresh control circuit 353 coincides with the row address stored in the address register 280, that is, when all of the word lines are selected, e.g., when a logic '1' is stored in all of the memory cells of array 351, the reset control circuit 270 inactivates the initialization signal (nRESET) in response to the output signal (COMP) of the comparative circuit 290. Accordingly, the process of writing the same data into the memory cells is terminated. By writing the same data into the memory cells, data stored before power-off may not be read out after power-on. In other words, when power is re-supplied after having been removed, previously stored data may not be read out.

It will be apparent to those skilled in the art that modifications and variations may be made to the examples discussed above. It is intended that the present invention covers such modifications and variations provided they come within the spirit and scope of the present invention as defined by the appended claims and their equivalents, that follow.

What is claimed is:

1. A dynamic random access memory device comprising:
   a memory cell array having memory cells arrayed in rows and columns;
   a reset control circuit for generating an initialization signal and a latch signal in response to an externally supplied reset command;
   a refresh control circuit for sequentially generating row addresses in response to the initialization signal;
   a row selection circuit for sequentially selecting rows in response to the generated row addresses; and
   burst write means, operating in response to the initialization signal, for sequentially selecting columns in a unit whenever each row is selected and writing the same data into memory cells associated with the selected columns, such that data stored in the memory cells before power-off is not read out at power-on.

2. The dynamic random access memory device of claim 1, wherein the burst write means comprises:
   an address generator circuit for sequentially generating column addresses in response to the initialization signal;
   a column selection circuit for generating column selection signals for selecting the columns in the unit in response to the column addresses;
   a data input buffer for setting input/output lines to the same value in response to the initialization signal;
   a column gate circuit for selecting the columns in the unit in response to the column selection signals and connecting the selected columns to the input/output lines; and
   a sense amplification circuit for performing a sense amplification operation such that data associated with the selected columns is stored in corresponding memory cells.

3. The dynamic random access memory device of claim 2, further comprising:
   an address register for latching a row address first output from the refresh control circuit in response to the latch signal; and
   a comparative circuit for determining whether or not a row address output from the refresh control circuit coincides with an address stored in the address register.

4. The dynamic random access memory device of claim 3, wherein the reset control circuit inactivates the refresh control circuit and the burst write means in response to an output signal of the comparative circuit when the row address output from the refresh control circuit coincides with an address stored in the address register.

5. A method for preventing data stored in memory from being read-out comprising:
   a memory cell array having memory cells arrayed in rows and columns;
   generating an initialization signal and a latch signal in response to an externally supplied reset command;
   sequentially generating row addresses in response to the initialization signal;
   sequentially selecting rows in response to the generated row addresses; and
   in response to the initialization signal, sequentially selecting columns in a unit whenever each row is selected and writing the same data into memory cells associated with the selected columns, such that data stored in the memory cells before power-off is not read out at power-on.

* * * * *